United States Patent [19]

Miller

[11] 4,309,496

[45] Jan. 5, 1982

[54] METHOD FOR OPTIMIZATION OF IMAGE REPRODUCTION PROCESSES

[76] Inventor: Dennis B. Miller, 1169 LaSalle Ave., Grand Island, N.Y. 14072

[21] Appl. No.: 186,203

[22] Filed: Sep. 10, 1980

[51] Int. Cl.³ .............................................. G03F 1/00
[52] U.S. Cl. .................................... 430/30; 430/358; 101/211; 356/404; 356/419; 356/421
[58] Field of Search ................. 430/30, 358; 356/416, 356/419, 421, 404; 101/211

[56] References Cited

U.S. PATENT DOCUMENTS

| | | | |
|---|---|---|---|
| 3,819,373 | 6/1974 | Sable | 430/30 |
| 3,913,477 | 10/1975 | Howland et al. | 430/30 |
| 3,977,872 | 8/1976 | Hellmig | 430/30 |
| 4,104,069 | 8/1978 | Vanheerentals et al. | 430/30 |

*Primary Examiner*—J. Travis Brown
*Attorney, Agent, or Firm*—Allen J. Jaffe

[57] ABSTRACT

A method of optimizing reproduction processes including the steps of preparing a physical standard, measuring the filtration and exposure values or densities used in preparing the standard, separating the image used in producing the standard into its color constituents using filtration values that are a function of those employed in making the standard, using a reproduction process to make many replicates of the standard, comparing representative samples of the replicate with the standard upon which the separations were based to measure the average difference in densities between the standard and such replicates, adjusting the filtration used in making the separations in response to such average differences until subsequent comparisons between subsequent standards yield average differences between acceptable, predetermined limits.

13 Claims, No Drawings

METHOD FOR OPTIMIZATION OF IMAGE REPRODUCTION PROCESSES

BACKGROUND OF THE INVENTION

The present invention relates to a method for optimization and control in the preparation of overlapping images used in reproduction processes and, more particularly, to such a method for optimization, control and standardization of multi-color reproduction processes such as, by way of example, those processes that are employed in the printing or reproduction of a number of copies or representations of an original image.

Presently known methods for producing reproductions in multi-color format generally have the following steps in common:

1. the production of images to correct, enhance or modify various values of subsequent image carriers, such as the production of masks, the use of which may be optional;
2. separation of the desired multi-colored image into its color components and recording each component on separate image carriers;
3. preparation, by any one of a variety of techniques, of subsequent image carriers which may be employed in any given reproduction process, such as plates or the like, for each separation; and
4. employing such plates or the like in any one of a number of well known printing processes, whereby reproductions are made through the use of different colorants, such as inks or dyes, placed in register to produce a multi-colored representation of the original image.

Other steps not mentioned above may include half-tone conversions and the like. In any event, regardless of the particular process and the number of steps involved in the practice thereof, the results may be less than desirable when the final production is compared with the original image. Moreover, a lack of consistency may be apparent when the final products are compared to each other, much less to the original. This makes evaluation of the reproduction process all the more difficult due to the uncertainty as to which result is truly typical of the reproduction process.

The reasons for such inconsistencies and such undesired results are many; however, foremost among these are the inherent variabilities associated with the reproduction process, including those associated with the production of the original image or photograph itself and the pre-printing or pre-press areas as well as those associated with the printing of the reproductions. Turning to the area of printing the reproductions in general and to a newspaper press as a specific example, some of the variables involved are as follows:

1. skill of operators;
2. variations in thickness of colorants;
3. variations in colorant levels;
4. variations in press speed; and
5. variations in half-tone dot registration.

Thus, even assuming the pre-printing or pre-press operations and procedures can be held relatively constant, the pressures of time, economy and the like dictate against precise control over all the variables associated with a particular machine or press employed to print the reproductions in large quantities. More importantly, even attempts to control one or more of the variables involved may not lead to a satisfactory reproduction when compared to the original on a routine, periodic basis in as much as presently employed measuring techniques are inadequate to accurately represent the desired results. There is, thus, lacking a method of measurement that optimally correlates the original with the intended or desired final reproduction on a consistent and regular basis, much less permitting an objective statement of the desired results should the original be less than satisfactory.

However, in practice, problems in variability are associated with present techniques employed in the pre-printing or pre-press operations. These areas as taken here, involve all the steps from the picture-taking through separation to plate making.

In present practice, the original photo or image submitted for reproduction may consist of a negative, an internegative, a positive transparency, a print or even an electronically reproduced image. In any case, a decision is made that this original is what is desired to be reproduced. However, since such decision is usually subjective, based on experience, and since the human eye is capable of resolving errors or correcting for incorrect color balance or for different light sources, it is not surprising that the final reproductions often do not compare favorably to an accurate representation of what was really desired. In an attempt to overcome this problem a number of measuring techniques are available and utilized. One technique measures neutrals in the image and is based on the assumption that there are neutrals to measure and that the operator will be able to identify what should be neutral so that he can make the measure. Another technique measures flesh tones (or some similarly identifiable color); however, since flesh tones vary considerably in color, this technique is dependent on chance, operator skill or both. A third technique assumes that integration of all the colors within the original will balance out to neutral and an attempt is made to measure the mix of colors in the original. As above, this technique is also a matter of chance and/or operator skill. A further technique employs the use of a separate gray scale which is measured to determine separation values; however, this technique is based on the unlikely assumption that the original is perfect. It should be apparent, accordingly, in the pre-printing or pre-press stage of the entire reproduction process there is similarly lacking a method of measurement that optimally correlates a original with a desired final result on a consistent and objective basis.

SUMMARY OF THE INVENTION

The present invention overcomes the foregoing problems, as well as others not specifically mentioned, by providing a method for the optimization of reproduction processes of complex overlapping images, such as process color reproduction, which method contemplates and teaches a unique way of objectively measuring the original input (such as a photographic image) to the reproduction process against the final reproductions (such as a full-color lithographic reproduction, for example) to indicate corrective adjustments for improving otherwise unsuspected deficiencies in reproduction in such a manner that the reproductions represent an optimal representation of the desired inputs, without reliance on chance, operator skill and/or presently known measurement techniques in the sense of those as previously mentioned.

The method of the present invention recognizes that the subjective or judgmental desires of an individual cannot be measured directly or even accurately communicated in words from one individual to another in order to determine the relationship between the characteristics of the input to the reproduction process to that of the desired resultant characteristics of the reproduction process. Thus, one aspect of the present method involves the measurement of the physical parameters required to produce a physical standard (such as a reflective positive photographic image, for example) which is determined, by whatever mode of decision making or measurement, to best represent the subjective or objective values sought. This standard, then, represents the desired output or goal of the reproduction process. For example, in the case of continuous tone photographic originals from which one or a number of prints can be made (using a measured light source such as a dichroic color head on an enlarger, for example) from which one print can be chosen as the best or closest representation of the desires of the decision maker or image evaluator be it a person, a group of persons, a physical device (such as a densitometer or color analyser) or a combination thereof. The filtration density values (both color density or equivalent neutral density of colors and neutral density), the exposure values, the lens aperture, and the reproduction ratio of such print can be accurately measured as can the speed and contrast of the photographic material, the processing level of the chemicals used to produce such print, and any other factors such as might influence the production of such print can be measured and joined together as an accurate measurement of those parameters necessary to produce such print. As used herein the term "physical standard" should be taken as meaning: a physical image which best represents the desired objective of the reproduction process.

These measured parameters then form the basis for producing monotone images or separations, the masks (if used), the halftones (if made) and any other components of the process prior to the production of the separate final image carriers, such as printing plates or the like, from which the reproductions are to be made.

After reproductions are made in any one of a number of well known ways, representative samples thereof are compared with the physical standard to measure the differences therebetween in terms of density values or parameters employed in producing the standard. If such differences are found to exceed predetermined limits, then adjustments are made to the filtration values employed in producing the separations, and additional reproductions are produced at these adjusted values. This process is repeated until the average differences of all the representative samples only vary from their respective physical standard by an acceptable amount, measured in terms of the same density values or parameters utilized in producing the respective standard. At which point the reproduction process has been optimized.

After such optimization, the present method then identifies those specific samples that best represent the average output of the reproduction process which will permit easy observation of other characteristics that may have been undetected and which, now, can be corrected according to well known techniques, as will become apparent hereinbelow. After such corrections, it may be necessary to repeat the optimization steps for a new optimization in the event that such corrections may have unbalanced the original optimization. Thus, the method of the present invention, upon reaching its optimization of the reproduction process, becomes a very powerful tool in diagnosing errors beyond color balance and overall density, that may become apparent in the output after optimization. If any such errors are discovered, they may be corrected and the optimization process repeated, until no significant average differences exist between a representative sampling of reproductions and their respective physical standards to thereby establish a new optimization. Further, the optimization process can be continuously employed for control and monitoring purposes.

The present invention also affords a method whereby the intended color content of the original image can be preserved and later reproduced by a standardized procedure. Moreover, reproductions can be optimized at remote locations to thereby permit control of the reproduction processes over widely separated geographic areas, and even bring the products of diverse processes into a substantial common representation.

The present invention further affords a method whereby a color printing material can be adjusted and controlled in accordance with the measurements of the physical standard suitably converted by means of known conversion values for such printing material.

The present invention further provides an improved process for producing the separations and for adjusting the filtration values thereof in response to the measured average difference between the physical standards and the reproduction samples. In the case of full color reproduction, present techniques for producing the separations employ additive filtration to separate the image into three, colorcoded monotones, which are ultimately recombined in the reproduction process to represent the image in its original colors. If changes are required in one or more of such additive filters, this is usually accomplished by varying the exposure time through those filters requiring change. In film-based systems this adds one more degree of variability to the reproduction process, namely that of time related reciprocity errors or the like. According to the present method, the separations can be produced through additive filters; however, in the event of a required change, this can easily be accomplished by varying the subtractive filtration values which may be employed in producing the photographic standards. In this manner, the exposure time through the additive filtration can remain constant and, yet, changes can be accommodated by modulating the complement or complements of the additive filter or filters requiring such change. A similar process can be employed in the production of masks if the same are utilized.

Essentially, then, the present invention provides a method for optimization of reproduction processes, comprising the steps of; producing from at least one original image a corresponding physical standard, measuring at least the density values of the filtration employed in producing the physical standard, separating the original image into a corresponding set of monotone images using exposure values modified as a function of the filtration values employed in producing the corresponding physical standard, preparing at least one reproduction from the set of monotone images, comparing a representative sampling of the reproductions with its corresponding physical standard to measure at least the average difference in density therebetween and adjusting the exposure values to modify subsequent sets of monotone images until the average differences in density from reproductions thereof differ from corresponding subsequent physical standards within predetermined limits.

In the event masking is employed, it is a further feature of the present invention that the exposure of such masks together with their normal masking filtration is modified as a function of at least the filtration values employed in producing the physical standard. In this manner, the exposure and processing (such as chemical or electronic) of the masks is standardized.

Other features and advantages of the present invention will become apparent as a description thereof proceeds.

DESCRIPTION OF THE PREFERRED EMBODIMENT

Although the forthcoming description will refer to such terms as "enlargers", "dichroic heads", "filters", "separation filters", "masks", "half-tones", "plates", "press" and the like, it should be understood that these terms and the physical components they represent are used merely as examples of the preferred manner in which the present invention can be accomplished. Therefore, such physical components should be taken as exemplary components and not as essential or limiting components in the practice of the invention. It is contemplated that other well known equivalents may be substituted for one or more of such components.

Initially, a physical standard is produced from an original image that is presented for reproduction. Such original may, by way of example, take one or more of the following forms:
I. a negative which may comprise:
  (1) an original negative exposed in a camera; or
  (2) an internegative produced from:
    (a) a positive transparency; or
    (b) a positive reflection copy or print; or
    (c) a duplicate of either of the above; or
    (d) a print duplicate of either of the above such as a "Polaroid" duplicate.
II. a transparency or slide which may comprise:
  (1) an original transparency exposed in a camera; or
  (2) a duplicate transparency produced from:
    (a) a positive transparency; or
    (b) a positive reflection copy; or
    (c) a film duplicate; or
    (d) a print duplicate.
  (3) a transparency produced from a negative.
III. a reflection print which may be produced from:
  (1) an original negative; or
  (2) a positive transparency; or
  (3) an internegative; or
  (4) the scene directly as with an "instant" print camera such as a "Polaroid"; or
  (5) a print duplicate from a transparency; or
  (6) a print duplicate from a print.
IV. others, such as electronically transmitted images, or original or reproduced art work that may be copied or photographed in order to prepare a physical standard.

Although the original can be any image or can take any one of the above forms, for simplicity of discussion, it will be assumed that the original is a color negative. Prior to the production of a physical standard, information concerning the color negative is collected and stored. Such information (for this example) may preferably include the situation under which the film was exposed (such as daylight or flash), the speed of the film, the emulsion number and the like.

A physical standard is produced from the color negative utilizing any well known photographic techniques as, for example, an enlarger with means to vary subtractive filtration such as a dichroic filter head or the like. Thus, for this example, the physical standard will be a full color reflection print. It is important that the chemical processing steps leading to the production of this print be held constant and consistent, as is standard practice. In general, a print should be made which best reflects the desired color balance and overall density. If desired, separate black and white prints may be made to judge exposure. The best color print is then chosen as the physical standard upon which the rest of the reproduction process will be based.

The parameters leading to the production of the physical standard are carefully measured and stored. These parameters may include the color filtration values (expressed in terms of density), the exposure values, the reproduction ratio or magnification and any other factors necessary to replicate this standard may also be measured as mentioned earlier. The densities can be measured with any well known instruments for this purpose. Thus, all the information necessary to faithfully duplicate this physical standard is measured and stored. As is well known such information, together with all other information and data referred to herein, may be stored in a computer data base. After the production of the physical standard, the next steps relate to those necessary for the reproduction based on the photographic standard. However, regardless of the particular type of reproduction process employed to make multiple copies, separation images are usually required. Therefore, the next general step to be discussed will be the production of separation images.

By way of example, any one or combinations of one or more of the following well known separation techniques may be employed:
I. continuous tone, for
  (a) use directly as a continuous tone or random dot image;
  (b) subsequent halftoning; or
  (c) subsequent conversion to some alternate structure such as a news service wire transmission.
II. halftones, made from
  (a) direct screen;
  (b) indirect screen; or
  (c) electronic scanner.
III. discrete or electronic, comprising
  (a) digital techniques;
  (b) analog techniques; or
  (c) others, such as any uncommon means of breaking up the image such as lenticular or other screens.
IV. any combinations of the above
  (a) for example, indirect screen is a combination of continuous tone and half-tone techniques.

The separation systems may be masked or not. If masking is employed, the masks may be:
I. colored dye or pigment;
II. silver based with filters;
III. non silver-based materials with filters;
IV. electronic with filters;
V. any of the above in combination with or without filters;

If it is assumed that filters are used for the separation as, for example, red, blue and green additives, present techniques attempt at proper exposure through each filter by varying the exposure time through each. In accordance with the present method, adjustments, if required, may be made by the use of modulating means which may take the form of the subtractive complements of the additive filters whereby adjustments in the densities of one or more of these subtractive complements will modulate the intensity of light at the bandwidth of one or more of the additives to achieve proper exposure without the necessity of varying the exposure time. Thus, as will be discussed in greater detail hereinbelow, adjustments in the separation and/or masking process can easily be accomplished by varying the subtractive filtration that was used in producing the original separations, based on the data used to produce the physical photographic standard. Irrespective of the particular separation and/or masking process employed, the control filtration values will be a function of those values used in producing the physical standard suitably corrected or converted by known factors which are a function of the response of the separation and mask (if used) materials. In continuous tone color photography the analogy would be changing the filter pack to satisfy the requirements of a new paper of different emulsion. All the intermediate steps and conversions are held constant in accordance with well known photographic processing practices.

The next step is the manufacture of reproductions. Various known reproduction processes can by employed; however it will be assumed for exemplary purposes that the reproduction process will be a printing press similar to the type used in the production of newspapers and the like. Plates are prepared from the separated images, which may be masked and half-toned, as is conventional. One or more runs of the press are made whereby a number of reproductions are produced, from which representative samples are taken and compared to their respective physical standard upon which the separations were based and a measure of the average differences in color balance between the selected samples and their respective standard is made. Overall differences in density may also be measured. These measurements can be performed with any well known instruments or aids as, for example, densitometers for sampling or integrating or viewing filters of known density values. The difference between the samples and their respective standard are preferably expressed in terms of density values. If the average differences between the samples and their respective standard fall within predetermined limits of color or overall density, say 0.05 density units, for example, and if the sampling is truly representative of the press output (as may be determined by any well known statistical test such as a Student-t test), then no changes are made to the filtration density values employed in producing the separations. If differences are detected beyond the acceptable range of density values, the filtration employed in preparing the separations is adjusted in accordance with the average differences. For example, if the average difference turns out to be 0.10 density in the yellow and magenta (equivalent to 10 yellow and 10 magenta), then the subtractive filtration is changed by an equivalent amount in making the new separations; the additive filtration and therefore the exposure time remaining unchanged. Additional press runs may then be made from new sets of separations (made from additional originals as a function of physical standards corresponding thereto) utilizing the adjusted filtration values, 10 yellow and 10 magenta for this example. This process is repeated until no significant average differences are detected or measured beyond acceptable limits.

When a representative sampling of the particular press, in this example, does not yield average measurements beyond the predetermined limits of acceptability, the collected samples associated with optimization may be compared with their respective physical standard to chose those single samples that are closest in overall density and color balance to their respective physical standard. While these samples that are the closest best represent the average output they may still have a number of faults in common such as high contrast, for example, or they may all have a color shift in one direction in some portion of their tonal reproduction such as in the highlights or shadows. Regardless of the fault, this will become an indication of some error in the photographic, pre-press or press operation, which can be corrected with known technology and the optimization process can be repeated with subsequent press runs as a continuing check on color balance and density. Thus, the method of the present invention will zero-in on inherent problems associated with the reproduction process and can function as a powerful diagnostic tool in correcting such problems on the way towards optimization to any specified level or goal for the particular reproduction process. That is to say, since it is possible to run multiple optimizations on a printing press at one time it should be a simple matter to continue with an old optimization until such time as a new one proves superior. Such a procedure will allow additional samples for comparison and may serve to negate any new, undetected changes in the reproduction system (such as inks with a shift rheology or coloration).

EXAMPLES

To illustrate in a general way, the manner in which the method of the present invention can be practiced, a number of examples will be given with the use of actual density values. In these examples, it will be assumed that a change in filtration and/or exposure of ±0.05 density units in measured output will be significant. It is to be recognized that these limits are exemplary and that actual values might be closer to ±0.02 density units. The density values are expressed, unless otherwise indicated, in conventional filtration values. Thus, 0.17 density units in, say, yellow would be equal to 17Y. No measured changes in cyan filtration appear in the examples since all changes in color balance can be expressed in terms of yellow and magenta. However, cyan might also be used and is important in the area of exposure control in the form of neutral density filtration. Further, the density values given for each physical standard represent the color filtration employed in producing that standard. The conversion values for the separations represent the known factors in changing from the color print material to the separation materials. The adjustment values represent the average differences between the reproductions and the standard, when the same exceeds the predetermined limits.

The measured changes can be accomplished by the use of any well known instruments or aids such as previously mentioned. In any case, the values given represent a difference between the sample and standard and therefore indicate measured degree of dissatisfaction or error. For example, a measured change of 8M would indicate that a change of 8M is required for correction. Of course, when using viewing filters it may be easier to indicate the actual required correction in that these filters may be calibrated in terms of densities necessary to make a correction.

It should also be noted that no values for additive filtration are given in these examples in that such values, according to one aspect of the present invention, may be held constant and any changes required may be accomplished by varying the complementary values which are included in the values indicated for the separation conversion filtration. If necessary or desired, adjustments may be made in exposure or intensity of illumination.

| BATCH NO. 1 | | | |
|---|---|---|---|
| Physical Standard | 70Y | 30M | 0C |
| Conversion to Separations | −10Y | 11M | 50C |
| Adjustments | 0Y | 0M | 0C |
| Separation Filtration | 60Y | 41M | 50C |

| Represent-ative Sample NO. | Measured Change in Yellow | Measured Change in Magenta | Measured Change in Cyan | Measured Change in Density |
|---|---|---|---|---|
| 1. | −16 | −10 | 0 | −8 |
| 2. | −14 | 2 | 0 | −7 |
| 3. | −11 | −4 | 0 | 2 |
| 4. | −16 | −4 | 0 | 1 |
| 5. | −9 | −6 | 0 | −3 |
| 6. | −16 | −4 | 0 | −3 |
| 7. | −9 | −7 | 0 | −5 |
| 8. | −9 | −3 | 0 | −1 |
| Average Difference From Standard | −12.5 | −4.5 | 0 | −3 |

At the end of this batch, it is noted that only the yellow filtration should be changed (indicating too much blue) since the other average differences fall between the accepted limits of ±0.05 density units. A subtraction of 13Y is made for batch NO. 2.

| BATCH NO. 2 | | | |
|---|---|---|---|
| Physical Standard | 55Y | 40M | 0C |
| Conversion to Separations | −10Y | 11M | 50C |
| Adjustments | −13Y | 0M | 0C |
| Separation Filtration | 32Y | 51M | 50C |

| Represent-ative Sample NO. | Measured Change in Yellow | Measured Change in Magenta | Measured Change in Cyan | Measured Change in Density |
|---|---|---|---|---|
| 1. | 5 | 1 | 0 | −5 |
| 2. | 5 | 0 | 0 | 1 |
| 3. | 1 | −2 | 0 | 0 |
| 4. | 1 | 0 | 0 | −3 |
| 5. | 0 | −2 | 0 | −1 |
| 6. | 1 | −3 | 0 | −6 |
| 7. | 2 | −4 | 0 | −3 |
| 8. | 3 | −1 | 0 | −6 |
| Average Difference From Standard | 2.25 | −1.375 | 0 | −2.875 |

The results of batch NO. 2 indicate that all values fall within the acceptable limits which, for this example, are ±0.05 density units. Therefore, it can be concluded that the reproduction process is optimized at adjusted separation conversion values of −23Y (−10Y plus −13Y), 11M and 50 C. Additional runs or batches may be made at these adjusted conversion values with additional physical standards for each. When the results of such runs or batches indicate that no adjustments are necessary, then one sample from each reproduction at the optimized conversion values is selected which most closely matches its respective physical standard. These samples, which typify the reproduction process, are then compared with each other to determine whether they evidence any common faults beyond color balance and overall density; these latter faults having already been corrected by the optimization process. If any such common faults are found, these may be corrected using known technology. For example, assuming a common fault of high contrast is discovered, then this can be corrected by adjusting flash exposure in making the halftones, as is well known. Additionally, a normally difficult judgment regarding the effectiveness of color correcting masking or the like, may be more easily made in as much as the color balance has been optimized. For example, it becomes a simple matter to adjust masking exposure using exposure intensity values modified as a function of the filtration values employed in producing the physical standard. After such corrections, representative samples of additional runs or batches are compared with their respective standards to determine whether the correction upset the color balance and/or overall density, if so, the optimization process is repeated until the average differences between the representatives samples of each run or batch and the respective physical standard fall within the predetermined limits, in response to the adjusted separation conversion values.

It is significant to note, although not appearing in the above simplified runs, that the additive filters through which the separation exposures were made were not changed, nor was the exposure time changed. All changes occured in the complementary or subtractive filtration densities. Thus, the same set of additive filters at the same exposure values can be used for all runs. However, as mentioned earlier, it is possible if desired, to change additive filter exposure times.

Once the reproduction process is optimized, it becomes a simple matter to exercise creative control in effectuating desired changes in the final reproduction output. Thus, if one wanted a red apple to look green, a physical standard would be produced depicting the desired effect.

The second area for creative control comes from the potential afforded by the process of the present invention to have more than one optimization. That is, the method of the present invention will permit not only the handling of different photographic situations (such as daylight or electronic flash scenes), but also permit the tailoring of situations to meet creative goals. One such goal might be to alter the contrast of a scene.

In summary, then, the essential steps that characterize the present invention, include the following:

(1) Preparation of a physical standard from an original image, the standard may be a reflective print image, as in the above examples, as well as any image in any medium or format which represents the desired results of the reproduction process;

(2) Measurement of the parameters required to produce such standard, such as filtration values and exposure values;

(3) Preparation of separation images and masks, if used, from the original image based on conversion values which are functions of the measured values of the standard, the separations can similarly take any form including those produced by electronic scanners and they can be two or more monotones representing at least two color components of the standard;

(4) Preparation of one or more reproductions from the separation images using any one of a number of well known reproduction processes in addition to the printing press examples, supra;

(5) Comparing a representative sampling from the reproduction process with their standard to measure, at least, the average differences in density values between such samples and the standard; and (6) adjusting the conversion values of the separation images in response to such average differences in the making of subsequent separation images based on subsequent original images until the average differences between the reproductions and their respective standard fall within a predetermined range of values.

Other significant steps include the selection, after no further adjustments of the conversion values are necessary, of the samples from each optimized reproduction that most closely matches the corresponding physical standards and the comparison of such samples to determine whether common faults exist. These faults can then be corrected and the process is repeated to determine whether such correction upset the optimization in color balance or exposure density and, if so, new sets of optimized conversion values are determined.

Although a preferred embodiment of the present invention has been disclosed and described, changes will obviously occur to those skilled in the art. It is therefore intended that the present invention is to be limited only by the scope of the appended claims.

What is claimed is:

1. A method for optimization of reproduction processes, including the steps of:
   (1) producing, from at least one original image, a corresponding physical standard,
   (2) measuring at least the density values of the filtration employed in producing the physical standard,
   (3) separating the original image into a corresponding set of separate monotone images using exposure intensity values modified as a function of the filtration values employed in producing the corresponding physical standard,
   (4) preparing at least one reproduction from the set of separate monotone images, and
   (5) comparing a representative sampling of the reproductions with its corresponding physical standard to measure at least the average difference in density therebetween.

2. The method according to claim 1, further including the step of:
   (6) adjusting the exposure intensity values to modify subsequent sets of separate monotone images until the average differences in density from reproductions thereof and their corresponding physical standards fall within predetermined limits.

3. The method according to claim 2, wherein:
   (7) said step of separating includes the use of additive filtration in the preparation of said separate monotone images, and
   (8) said step of adjusting the exposure intensity values includes changing the subtractive complements of said additive filtration.

4. The method according to claim 3, wherein:
   (9) said step of preparing said reproduction includes a printing press reproduction process.

5. The method according to claim 2, further comprising the steps of:
   (7) selecting from each representative sampling one reproduction that most closely matches its corresponding physical standard, and
   (8) comparing each of the selected reproductions to determine whether they evidence any common faults.

6. The method according to claim 1, wherein:
   (6) said step of separating includes the use of additive filtration in the preparation of said sets of separate monotone images, and further comprising the step of:
   (7) adjusting the subtractive complements of said additive filtration in response to said measured average differences in density.

7. The method according to claim 1, further including the step of:
   (6) masking said original image using exposure intensity values modified as a function of the filtration values employed in producing said corresponding physical standard.

8. A method for optimization of reproduction processes, including the steps of:
   (1) separating an image into at least two separate monotone images using filtration,
   (2) combining said separate monotone images in a reproduction process to produce a replicate of said first mentioned image,
   (3) measuring at least density differences between said replicate and a corresponding physical standard, and
   (4) adjusting the filtration values for producing additional separate monotone images in response to said measured differences until said measured density differences fall within predetermined limits.

9. The method according to claim 8, wherein:
   (5) said step of adjusting includes modifying the complementary values of the filtration employed in separating said image.

10. The method according to claim 8, further including the step of:
    (5) masking said image employing exposure intensity values modified as a function of the filtration values used in separating said image.

11. The method according to claim 8, wherein:
    (5) said reproduction process produces a plurality of replicates, and wherein
    (6) said step of measuring includes measuring said differences between a representative sampling of each of said replicates and said corresponding physical standards.

12. The method according to claim 11, further including the steps of:
    (7) selecting from each representative sampling one replicate that most closely matches its corresponding physical standard, and
    (8) comparing each of the selected replicates to determine whether they evidence any common faults.

13. The method according to claim 12, wherein:
    (9) said reproduction process comprises a printing press.

* * * * *